(12) United States Patent
Arakawa

(10) Patent No.: US 6,624,038 B2
(45) Date of Patent: Sep. 23, 2003

(54) CAPACITOR ELECTRODE HAVING UNEVEN SURFACE FORMED BY USING HEMISPHERICAL GRAINED SILICON

(75) Inventor: Kazuki Arakawa, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 59 days.

(21) Appl. No.: 09/908,958

(22) Filed: Jul. 19, 2001

(65) Prior Publication Data
US 2002/0058393 A1 May 16, 2002

(30) Foreign Application Priority Data
Jul. 28, 2000 (JP) ........................................ 2000-228402

(51) Int. Cl.$^7$ ............................................. H01L 21/20
(52) U.S. Cl. ........................ 438/398; 438/238; 438/253; 438/255; 438/396; 438/785; 438/786; 438/774; 438/778
(58) Field of Search ................................ 438/238, 253, 438/255, 396, 398, 785, 786, 758, 774, 778, 708

(56) References Cited

U.S. PATENT DOCUMENTS

| | | | | |
|---|---|---|---|---|
| 6,110,772 A | * | 8/2000 | Takada et al. ............... | 438/238 |
| 6,204,120 B1 | * | 3/2001 | Gilboa et al. ............... | 438/255 |
| 6,218,230 B1 | * | 4/2001 | Fujiwara et al. ............. | 438/238 |
| 6,372,667 B1 | * | 4/2002 | Lee ............................. | 438/785 |

FOREIGN PATENT DOCUMENTS

| | | |
|---|---|---|
| JP | 11040809 | 2/1999 |
| JP | 11-163274 | 6/1999 |
| JP | 1122010764 | 8/1999 |
| JP | 11-330367 | 11/1999 |
| JP | 2000-022098 | 1/2000 |
| JP | 2000022110 | 1/2000 |

OTHER PUBLICATIONS

H. Watanabe, et al. Hemisphericalgrained Silicon (HSG–Si) Formation on In–Situ Phosphorous Doped Amorphous–Si Using the Seeding Method. 1992 pp. 422–424.

* cited by examiner

Primary Examiner—David Nelms
Assistant Examiner—Reneé R. Berry
(74) Attorney, Agent, or Firm—Katten Muchin Zavis Rosenman

(57) ABSTRACT

A lower electrode of a capacitor which has uneven surface formed by using HSG-Si (hemispherical grained silicon) and which is used, for example, in a semiconductor device such as DRAM device. Such lower electrode is fabricated as follows. An insulating film is formed on a semiconductor substrate, and a silicon film is formed on the insulating film. Then, the silicon film is selectively patterned to pattern it. The semiconductor substrate is heated to remove moisture in the insulating film. An oxide film on the surface of the silicon film is then removed. Thereafter, silicon nuclei are formed on the surface of the silicon film by heating the semiconductor substrate in atmosphere containing silicon compound gas. The silicon nuclei are then grown and thereby a lower electrode is formed which has hemispherical grains on the surface thereof.

18 Claims, 8 Drawing Sheets

PRIOR ART

PRIOR ART

US 6,624,038 B2

CAPACITOR ELECTRODE HAVING UNEVEN SURFACE FORMED BY USING HEMISPHERICAL GRAINED SILICON

FIELD OF THE INVENTION

The present invention relates generally to a capacitor electrode having an uneven surface and used in a semiconductor device. More particularly, the present invention relates to manufacturing a capacitor which has a lower electrode having an uneven surface formed by using Hemispherical Grained Silicon (HSG-Si).

BACKGROUND OF THE INVENTION

A Dynamic Random Access Memory (DRAM) device is a semiconductor device in which data can be stored and retrieved randomly. As a memory cell of the DRAM device, a memory cell comprising one transfer transistor and one capacitor is widely used. This is because, such memory cell has a simple structure and is suitable for use in a semiconductor device having high integration degree.

According to an everlasting increase in an integration degree of a semiconductor device, a capacitor having three dimensional structure has been developed and utilized as a capacitor for such memory cell. This is because, in a semiconductor device having a high integration degree, it is necessary to enlarge a surface area of each capacitor electrode within a reduced capacitor area in the semiconductor device.

Until now, various structures for the above-mentioned capacitor electrode are proposed, and some of them are practically used. Among them, there is known a technology proposed in a paper entitled as "Hemispherical Grained Silicon (HSG-Si) Formation on In-Situ Phosphorous Doped Amorphous-Si Using the Speeding Method", Solid State Devices and Materials, 1992, pp. 422–424. Hereafter, this technology is called HSG technology, and "Hemispherical Grained Silicon" is abbreviated to HSG-Si. The HSG technology is used as a technique for increasing a surface area of a lower electrode of a capacitor by forming unevenness on the surface of the lower electrode. It is considered that this technology is effective even in a DRAM device which has a memory capacity of 4 Giga-bits or so and in which fundamental design rule of a semiconductor element becomes approximately 0.13 $\mu$m.

There are many kinds of practical methods of forming a capacitor electrode by using the HSG technology. For example, Japanese patent laid-open publication No. 11-163274 proposes a method of efficiently forming uneven surface of an information storing electrode (hereafter, referred to as a lower electrode) of a capacitor by using HSG-Si.

With reference to the drawings, an explanation will be made on a conventional method of forming a lower electrode of a capacitor which is disclosed in the above-mentioned Japanese patent laid-open publication No. 11-163274. FIG. 8 is a cross sectional view showing a schematic structure of a lower electrode of a conventional capacitor, that is, a conventional stacked capacitor. FIG. 9 is a flow chart of manufacturing process showing a conventional method of forming unevenness on the surface of the lower electrode by using HSG-Si which comprises hemispherical grains of silicon.

First, with reference to FIG. 8, an explanation will be made on a lower electrode in which unevenness is formed on the surface thereof by using HSG-Si, that is, which has an uneven surface formed by using HSG-Si. A silicon substrate 101 is prepared. A diffusion layer 102 for capacitor, or a capacitor diffusion layer 102, is formed in the silicon substrate 101 in the proximity of the surface of the silicon substrate 101. An interlayer insulating film 103 which comprises a silicon oxide film is formed on whole area of the silicon substrate 101. The interlayer insulating film 103 is selectively removed to form a contact hole 104 reaching the surface of the diffusion layer for capacitor 102. Then, a lower electrode 105 is formed which electrically connects to the diffusion layer for capacitor 102. Thereafter, a surface unevenness portion 106 is formed on the surface of the lower electrode 105. FIG. 8 shows a structure obtained in this way.

Next, with reference to FIG. 9, an explanation will be made in more detail on a conventional method of forming the lower electrode 105 having the above-mentioned surface unevenness portion 106. After forming the contact hole 104 as mentioned above, an amorphous silicon film (hereafter referred to as a-Si film) is formed on the interlayer insulating film 103 such that the contact hole 104 is filled with material of the a-Si film. The a-Si film is deposited by using a reduced pressure chemical vapor deposition (CVD) method which uses mixed gas of monosilane ($SiH_4$) and phosphine ($PH_3$) or mixed gas of disilane ($Si_2H_6$) and phosphine ($PH_3$), as reaction gas. The a-Si film is then microfabricated by using photolithography technology and dry etching technology. That is, the a-Si film is patterned to form the lower electrode 105 (step S101).

Then, the workpiece, that is, the semiconductor substrate, undergoes cleaning by chemical solution such as acid solution and the like (step S102). Thereby, a trace of heavy metal or particles are removed. Then, an oxide film, that is, a native oxide film, formed on the surface of the patterned a-Si film is removed (step S103). After these processing steps, the workpiece, that is, the silicon substrate 101 is inserted into a reaction furnace having high vacuum condition. In this reaction furnace, HSG nuclei are formed on the surface of the a-Si film which is patterned as mentioned above, and are heat treated to form a HSG-Si portion (step S104). The HSG-Si portion thus formed constitutes the surface unevenness portion 106 illustrated in FIG. 8. Also, by this heat treatment, the patterned a-Si film is polycrystalized to become the lower electrode 105 which includes phosphorus impurities.

However, the above-mentioned conventional method of forming the lower electrode of a capacitor has the following disadvantage.

In a mass production process of DRAM's which uses lower electrodes having surface unevenness formed by using the HSG-Si, that is, hemispherical grains of silicon, as capacitor electrodes, the following disadvantage occurs. That is, there is a possibility that the surface unevenness is not formed uniformly on the surface of the lower electrode. If the unevenness is not formed uniformly, capacitance values of the capacitors vary, and may become out of standard. Therefore, there is a possibility that many defective devices are produced.

The inventor of this invention considered the causes of the above-mentioned disadvantage in detail. As a result thereof, the inventor found the following. In the above-mentioned heat treatment process or processes in which the HSG nuclei are formed on the surface of the a-Si film and further the HSG-Si portion is formed, moisture separates or is released from a semiconductor substrate, especially from an interlayer insulating film. The inventor found that the moisture separated from the semiconductor substrate has a great influence on the formation of the unevenness on the surface of the lower electrode. As will be mentioned in detail later, the moisture separated from the semiconductor substrate causes generation of Si-O bonds or couplings on the surface of the a-Si film. Unwanted objects including the Si-O bonds finally function so as to prevent formation of the HSG-Si. Thereby, densities of HSG nuclei on the surface of the a-Si film or diameters of hemispherical grains which comprise the HSG-Si may vary.

In a mass production line for semiconductor devices, semiconductor wafers on which many semiconductor devices are to be formed are often temporarily stored in a clean room until they undergo next process steps. While the semiconductor wafers are temporarily stored, moisture is absorbed into an interlayer insulating film comprising a silicon oxide film, in each of the semiconductor wafers, although the quantity of the moisture may be very small. It was also found that most of the moisture released from the interlayer insulating film during the above-mentioned process of forming the HSG-Si portion corresponds to the moisture absorbed into the interlayer insulating film while the semiconductor wafer is temporarily stored.

SUMMARY OF THE INVENTION

Therefore, it is an object of the present invention to provide a capacitor used in a semiconductor device and a method of manufacturing a lower electrode of such capacitor, in which the above-mentioned disadvantages of the conventional technologies can be obviated.

It is another object of the present invention to provide a capacitor used in a semiconductor device and a method of manufacturing a lower electrode of such capacitor, in which an HSG-Si film can be formed uniformly and stably on the surface of the lower electrode of the capacitor.

It is still another object of the present invention to provide a capacitor used in a semiconductor device and a method of manufacturing a lower electrode of such capacitor, in which an uneven portion can be formed uniformly and stably on the surface of the lower electrode of the capacitor.

It is still another object of the present invention to provide a capacitor used in a semiconductor device and a method of manufacturing a lower electrode of such capacitor, in which a capacitance value of the capacitor can be precisely controlled to a desired value.

It is still another object of the present invention to provide a capacitor used in a semiconductor device and a method of manufacturing a lower electrode of such capacitor, in which a surface area of the lower electrode of the capacitor can be precisely controlled to a desired value.

It is still another object of the present invention to provide a capacitor used in a semiconductor device and a method of manufacturing a lower electrode of such capacitor, in which a capacitance value of the capacitor can be increased and a manufacturing yield of the capacitor can be improved.

According to an aspect of the present invention, there is provided a method of manufacturing a lower electrode of a capacitor comprising: preparing a semiconductor substrate; forming an insulating film on said semiconductor substrate; forming a silicon film on said insulating film; selectively removing said silicon film to pattern it; heating the semiconductor substrate to remove moisture in the insulating film; after heating the semiconductor substrate to remove moisture in the insulating film, removing an oxide film formed on the surface of the silicon film; after removing the oxide film formed on the surface of the silicon film, forming silicon nuclei on the surface of the silicon film by heating the semiconductor substrate in atmosphere containing silicon compound gas; and growing the silicon nuclei and thereby forming a lower electrode which has hemispherical grains formed on the surface of the lower electrode.

In this case, it is preferable that, in the forming the silicon film on the insulating film, an amorphous silicon film in which impurities are doped is formed on the insulating film.

It is also preferable that the insulating film comprises a film which includes silicon oxide as main component.

It is further preferable that, in the heating the semiconductor substrate to remove moisture in the insulating film, the semiconductor substrate is heated at a temperature in a range between 450 and 500 degrees Celsius.

It is advantageous that the method further comprises selectively removing the insulating film to form an opening portion penetrating the insulating film; and wherein, in the forming the silicon film on the insulating film, the silicon film is formed on the insulating film such that material of the silicon film fills the opening portion and contacts the semiconductor substrate via the opening portion.

According to another aspect of the present invention, there is provided a method of manufacturing a lower electrode of a capacitor comprising: preparing a semiconductor substrate; forming an insulating film on the semiconductor substrate; forming a silicon film on whole surface of the insulating film; removing a native oxide film formed on the silicon film; after the removing a native oxide film formed on the silicon film, forming silicon nuclei on the surface of the silicon film by heating the semiconductor substrate in atmosphere containing silicon compound gas; growing the silicon nuclei and thereby forming hemispherical grains on the surface of the silicon film; and selectively removing the silicon film having hemispherical grains formed on the surface thereof and thereby forming a lower electrode.

In this case, it is preferable that, in the forming the silicon film on whole surface of the insulating film, an amorphous silicon film in which impurities are doped is formed on whole surface of the insulating film.

It is also preferable that the insulating film comprises a film which includes silicon oxide as main component.

It is further preferable that the method further comprises selectively removing the insulating film to form an opening portion penetrating the insulating film; and wherein, in the forming the silicon film on whole surface of the insulating film, the silicon film is formed on whole surface of the insulating film such that material of the silicon film fills the opening portion and contacts the semiconductor substrate via the opening portion.

According to still another aspect of the present invention, there is provided a method of manufacturing a lower electrode of a capacitor comprising: preparing a semiconductor substrate; forming an insulating film on the semiconductor substrate; selectively removing the insulating film to form a trench; forming a silicon film on the insulating film such that the silicon film is deposited on the bottom and side walls of the trench; removing a native oxide film formed on the silicon film; after the removing a native oxide film formed on the silicon film, forming silicon nuclei on the surface of the silicon film by heating the semiconductor substrate in atmosphere containing silicon compound gas; growing the silicon nuclei and thereby forming hemispherical grains on the surface of the silicon film; and selectively removing the silicon film having hemispherical grains formed on the surface thereof and thereby forming a lower electrode.

In this case, it is preferable the insulating film has a multi layer structure comprising a first insulating film and a second insulating film on the first insulating film; wherein, in the selectively removing the insulating film to form a trench, the second insulating film is selectively removed to form a first opening portion constituting the trench, and the first insulating film is exposed at the bottom portion of the first opening portion; and wherein, in the forming a silicon film on the insulating film, the silicon film is deposited on the portion of the first insulating film which expose at the bottom portion of the first opening portion and on the side wall of the first opening portion.

It is also preferable that the method further comprises, after selectively removing the insulating film to form a trench, selectively removing a portion of the first insulating film which exposes via the first opening portion to form a second opening portion smaller than the first opening portion; and wherein, in the forming a silicon film on the insulating film, material of the silicon film fills the second opening portion of the first insulating film and contacts the semiconductor substrate.

It is further preferable that, in the forming the silicon film on the insulating film, an amorphous silicon film in which impurities are doped is formed on whole surface of the insulating film.

It is advantageous that the first insulating film comprises a film which includes silicon oxide as main component.

According to still another aspect of the present invention, there is provided a method of manufacturing a lower electrode of a capacitor comprising: preparing a semiconductor substrate; forming a first insulating film on the semiconductor substrate; forming a second insulating film on the first insulating film, the second insulating film is made of water resistant material; forming a silicon film on the second insulating film; selectively removing the silicon film to pattern the silicon film; removing a native oxide film formed on the surface of the silicon film; after the removing a native oxide film formed on the surface of the silicon film, forming silicon nuclei on the surface of the silicon film by heating the semiconductor substrate in atmosphere containing silicon compound gas; and growing the silicon nuclei and thereby forming a lower electrode which has hemispherical grains on the surface of the lower electrode.

In this case, it is preferable that, in the forming the silicon film on the second insulating film, an amorphous silicon film in which impurities are doped is formed on the second insulating film.

It is also preferable that the first insulating film comprises a film which includes silicon oxide as main component, and the second insulating film comprises a film or films selected from a group of films consisting essentially of a silicon nitride film and a silicon oxynitride film.

It is further preferable that the method further comprises selectively removing the first and second insulating film to form an opening portion which penetrates the first and second insulating film; and wherein, in the forming a silicon film on the second insulating film, the silicon film is formed on the second insulating film such that material of the silicon film fills the opening portion and contacts the semiconductor substrate.

According to still another aspect of the present invention, there is provided a capacitor comprising: a semiconductor substrate; a first insulating film formed on the semiconductor substrate; a second insulating film formed on the first insulating film, the second insulating film is made of water resistant material; a lower electrode which is formed on the second insulating film and which has hemispherical grains on the surface of the lower electrode; a capacitor insulating film formed on the lower electrode; and an upper electrode formed on the capacitor insulating film.

In this case, it is preferable that the first insulating film comprises a film which includes silicon oxide as main component, the second insulating film comprises a film or films selected from a group of films consisting essentially of a silicon nitride film and a silicon oxynitride film, and the lower electrode is formed by heat treating an amorphous silicon layer.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
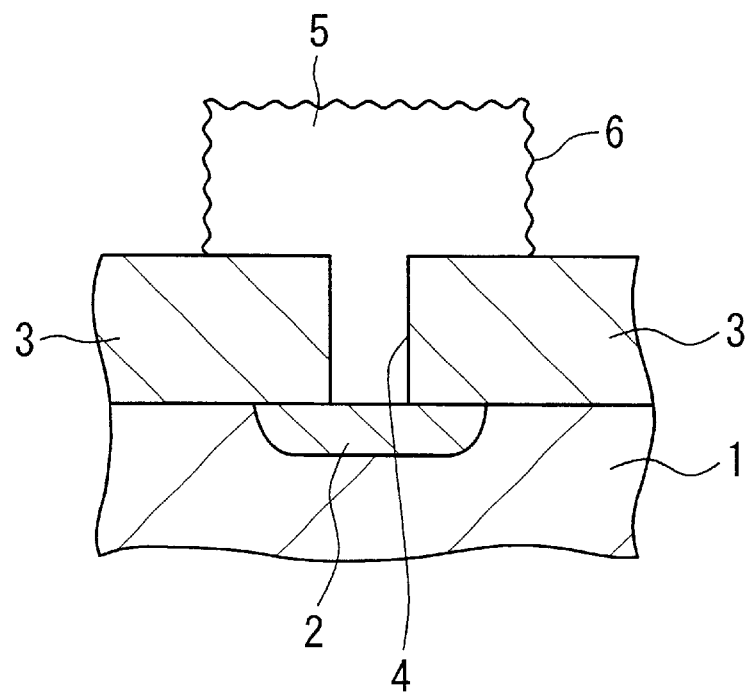
FIG. 1 is a cross sectional view schematically showing a structure of a lower electrode of a capacitor according to an embodiment of the present invention.
Figure 2:
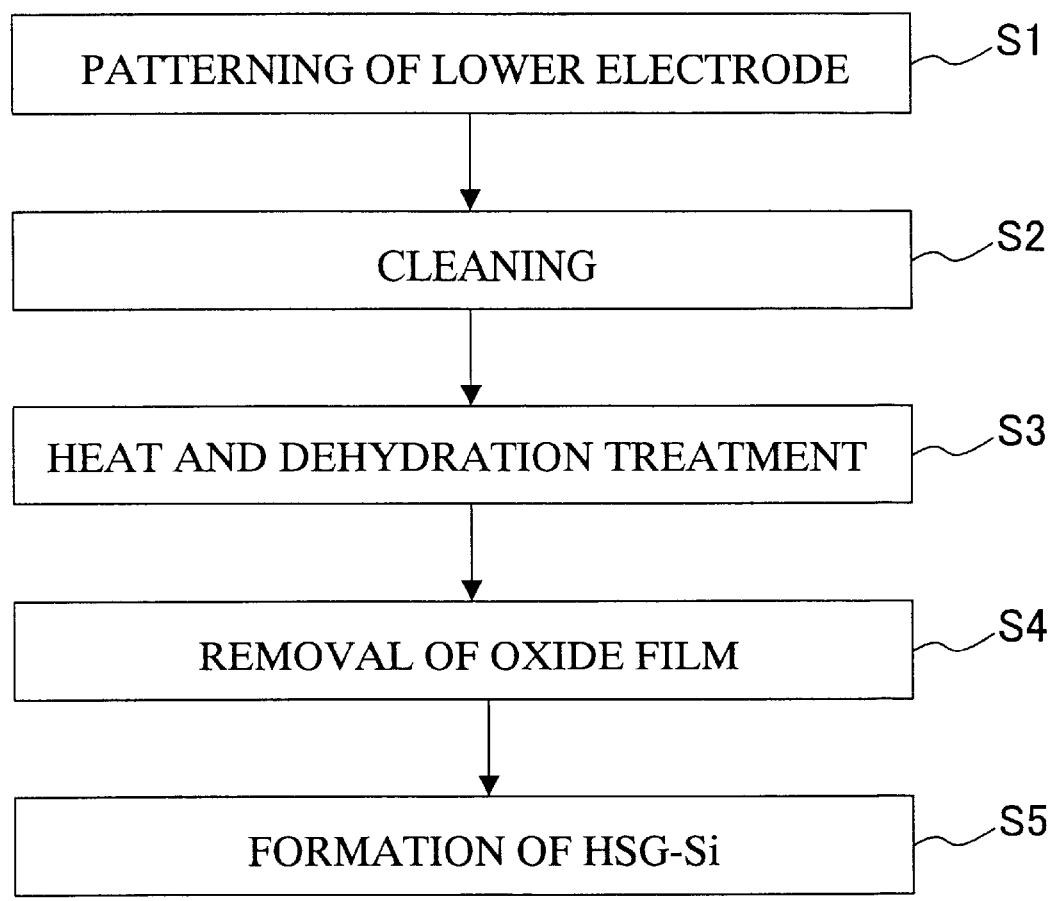
FIG. 2 is a flow chart showing a manufacturing process of a lower electrode of a capacitor shown in FIG. 1.

With reference to FIG. 1, FIG. 2, FIGS. 3A–3C and FIGS. 4A–4C, a description will now be made on a first embodiment of the present invention. FIG. 1 is a cross sectional view schematically showing a structure of a lower electrode of a capacitor according to the first embodiment. FIG. 2 is a flow chart showing a manufacturing process of a lower electrode of a capacitor shown in FIG. 1. FIGS. 3A–3C and FIGS. 4A–4C are cross sectional views illustrating formation of a HSG-Si portion on the surface of the lower electrode. The present embodiment is characterized in that a semiconductor substrate undergoes heat and dehydration treatment, before a process of removing a native oxide film on the surface of an a-Si film. By this heat and dehydration treatment, moisture contained in an interlayer insulating film mentioned above is removed.

As shown in FIG. 1, a silicon substrate 1 is prepared. A diffusion layer 2 for capacitor is formed in the silicon substrate 1 in the proximity of the surface of the silicon substrate 1. An interlayer insulating film 3 which comprises a silicon oxide film is formed on whole area of the silicon substrate 1. The interlayer insulating film 3 is selectively removed to form a contact hole 4 reaching the surface of the diffusion layer for capacitor 2. Then, a lower electrode 5 is formed which electrically connects to the diffusion layer for capacitor 2. Thereafter, a surface unevenness portion 6 is formed on the surface of the lower electrode 5. FIG. 1 shows a structure obtained in this way.

Next, with reference to FIG. 2, a more detailed explanation will be made on a process of fabricating a lower electrode 5. By a reduced pressure CVD method which uses mixed gas of, for example, $SiH_4$ and $PH_3$ as reaction gas, an a-Si film containing phosphorus impurities, that is, a P-doped a-Si film, is deposited on an interlayer insulating film 3 such that material of the P-doped a-Si film fills a contact hole 4 and contacts the diffusion layer 2 for capacitor via the contact hole 4. Here, a deposition temperature of the P-doped a-Si film is determined in a range between 500 degrees Celsius and 550 degrees Celsius.

Then, as shown in FIG. 1, the P-doped a-Si film is selectively removed and microfabricated by using photolithography technology and dry etching technology into a predetermined shape. That is, the P-doped a-Si film is patterned to form the lower electrode 5 (step S1).

The workpiece, that is, the semiconductor substrate, undergoes cleaning by mixed chemical solution comprising sulfuric acid or hydrochloric acid, hydrogen peroxide water and pure water, and/or cleaning by mixed chemical solution comprising ammonia water, hydrogen peroxide water and pure water (step S2). Thereby, a trace of heavy metal or particles adhered to a semiconductor substrate including various layers, here a silicon substrate, are removed.

As a first heat treatment, the semiconductor substrate is heat and dehydration treated (step S3). The temperature of the heat and dehydration treatment is in a range between 450 degrees Celsius and 500 degrees Celsius. The heat and dehydration treatment is performed in atmosphere of inert gas or in high vacuum condition. In this case, it is permissible that very small amount of oxygen or moisture exists in the atmosphere.

By this heat and dehydration treatment, moisture is removed from the semiconductor substrate including various layers. Especially, moisture in an interlayer insulating film 3 formed on the semiconductor substrate is removed.

In a semiconductor device, an interlayer insulating film is generally made of a silicon oxide film, or a BPSG (Boron-Phosphorus-Silicate-Glass) film which is a silicon oxide film including boron glass and phosphorus glass. By an analysis of the inventor of this invention, it was found that, in order to remove moisture within the interlayer insulating film as mentioned above, it is necessary to raise the temperature of the heat and dehydration treatment to 420 degrees Celsius or higher. Also, it was found that, when a practical treatment time is taken into consideration, the lower limit of the treatment temperature is 450 degrees Celsius. It was also found that the upper limit of the treatment temperature is 500 degrees Celsius. When the treatment temperature exceeds 500 degrees Celsius, polycrystallization begins in an inner portion of the P-doped a-Si film. When the polycrystallization begins, control for forming the HSG-Si mentioned later becomes very difficult. Thus, the temperature for the heat and dehydration treatment which is a characteristic feature of the present embodiment is preferably from 450 degrees Celsius to 500 degrees Celsius.

The semiconductor substrate is then soaked in dilute hydrofluoric acid which is mixed solution of hydrofluoric acid and pure water (or deionized water). Thereby, a native oxide film and the like formed on the surface of the P-doped a-Si film is removed, that is, an oxide film removal process is performed (step S4). Here, concentration of hydrofluoric acid in dilute hydrofluoric acid is 0.5 volume percent. In this process of oxide film removal, the native oxide film is removed and at the same time the surface of the P-doped a-Si film is protected by hydrogen atoms.

As mentioned above, in this embodiment, the process of removing an oxide film is performed by using dilute hydrofluoric acid (step S4), after the heat and dehydration treatment process (step S3). Therefore, even if the surface portion of the P-doped a-Si film is oxidized in the heat and dehydration treatment process (step S3), it is possible to remove the oxidized portion in the process of removing an oxide film which uses dilute hydrofluoric acid (step S4). Therefore, in the heat and dehydration treatment process (step S3), it is possible to select a heating temperature which provides high dehydration effect, almost without taking a treatment apparatus and treatment atmosphere into consideration.

The inventor of this invention has confirmed that, in the above-mentioned process of removing a native oxide film by using dilute hydrofluoric acid, moisture hardly enters the interlayer insulating film 3. This is because, it is considered that, even if a small quantity of moisture enters an inner portion of the interlayer insulating film 3 from the surface of thereof, portions of the interlayer insulating film 3 into which moisture has entered are etched away by the hydrofluoric acid.

After the above-mentioned process of removing an oxide film, the workpiece, that is, the silicon substrate, is inserted into a high vacuum reaction furnace which is a different one from the heat treatment furnace used in the above-mentioned heat and dehydration treatment. Then, a process of forming an HSG-Si portion is performed (step S5). The process of forming the HSG-Si portion comprises two heat treatment steps. First, the semiconductor substrate is heat treated in atmosphere containing silicon compound gas, for example, $SiH_4$ (monosilane) gas, and thereby silicon nuclei, that is, HSG nuclei are formed on the surface of the P-doped a-Si film which is previously patterned as mentioned above. Next, the semiconductor substrate is heat-treated in high vacuum condition, and thereby the HSG nuclei are grown and the HSG-Si portion is formed which comprises hemispherical grains. Also, by these heat treatment steps, the P-doped a-Si film is polycrystalized. In this way, a lower electrode of a capacitor is formed which lower electrode has unevenness on the surface thereof produced by the HSG-Si portions.

The heat treatment step for forming the HSG nuclei and the heat treatment step for growing the HSG nuclei can be performed continuously by using the same heat treatment apparatus as one heat treatment process. In these both heat treatment steps, it is also possible to use the same heating temperature and to only change heat treatment atmosphere between both heat treatment steps. Also, it is possible to change heating temperatures between both heat treatment steps.

Here, there is a possibility that, after the above-mentioned process of removing oxide film, semiconductor wafers on which many semiconductor devices are to be formed are temporarily stored in a clean room until they undergo next process steps. In such case, after the temporary store, the heat and dehydration treatment is again performed. Subsequently, the above-mentioned process of removing oxide film and the process of forming the HSG-Si portion are performed in sequence.

Figure 3A:
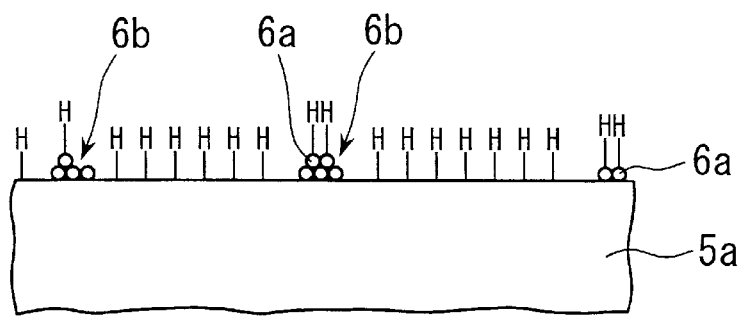
FIGS. 3A–3C are cross sectional views illustrating phenomena which occurs in a process of forming an HSG-Si portion according to an embodiment of the present invention.
Figure 3B:
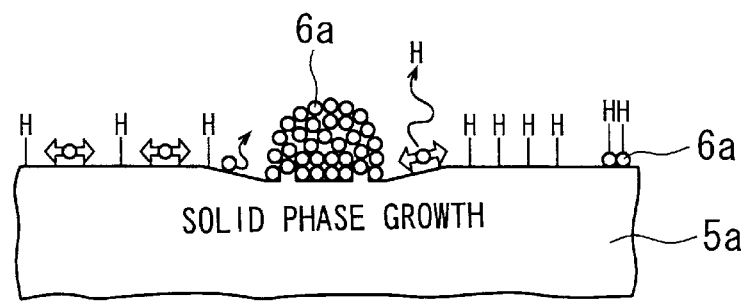
Figure 3C:
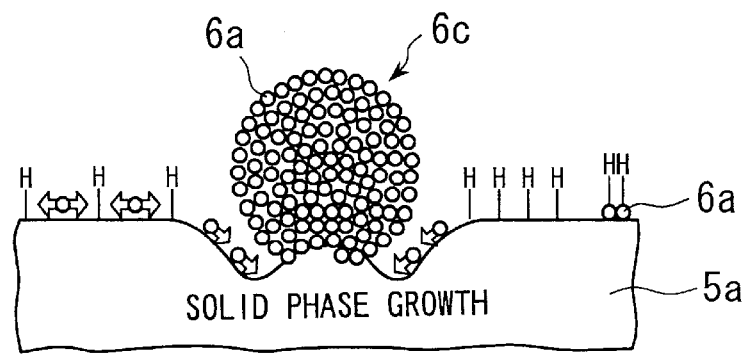

Next, with reference to FIGS. 3A–3C and FIGS. 4A–4C, an explanation will be made on a process of forming the HSG-Si portion in detail, and also a description will be made on advantageous effects of the present embodiment. FIGS. 3A–3C are cross sectional views illustrating phenomena caused in a process of forming the HSG-Si portion according to the present embodiment. In case the above-mentioned manufacturing process according to the present embodiment is performed, after the process of removing the oxide film (step S4), the surface of the P-doped a-Si film 5a which becomes a lower electrode is terminated and protected by hydrogen atoms, as shown in FIG. 3A. When $SiH_4$ gas is applied to the surface of the P-doped a-Si film 5a within the reaction furnace, in the process of forming the HSG-Si portion (step S5), HSG nuclei 6b comprising silicon atoms 6a are formed on the surface of the P-doped a-Si film 5a as shown in FIG. 3A. Subsequently, when the heat treatment, that is, annealing process, is performed within the reaction furnace, in a high vacuum condition, solid phase growth of silicon crystal starts from the HSG nuclei as the centers of growth, as shown in FIG. 3B. The temperature of this annealing process is approximately 600 degrees Celsius, and degree of vacuum thereof is approximately $10^{-4}$Pa. In this annealing process, hydrogen atoms at the surface of the P-doped a-Si film 5a separate therefrom by heat, and silicon atoms 6a at the surface of the P-doped a-Si film 5a surface-migrate. As the annealing process progresses, silicon atoms 6a gather around the HSG nuclei 6b, and the HSG-Si portion 6c having a large surface area are formed surely. Thereby, the lower electrode 5 having unevenness portion 6 caused by the HSG-Si portions 6c can be formed.

Thereafter, although not shown in the drawing, a capacitor insulating film made of a very thin silicon nitride film, a very thin tantalum oxide film or the like is formed on the surface of the lower electrode which has the unevenness caused by the HSG-Si portions. Then, an opposing electrode, that is, an upper electrode, is formed on the capacitor insulating film. Thereby, a capacitor, for example, a capacitor of a DRAM device, is completed.

Figure 4A:
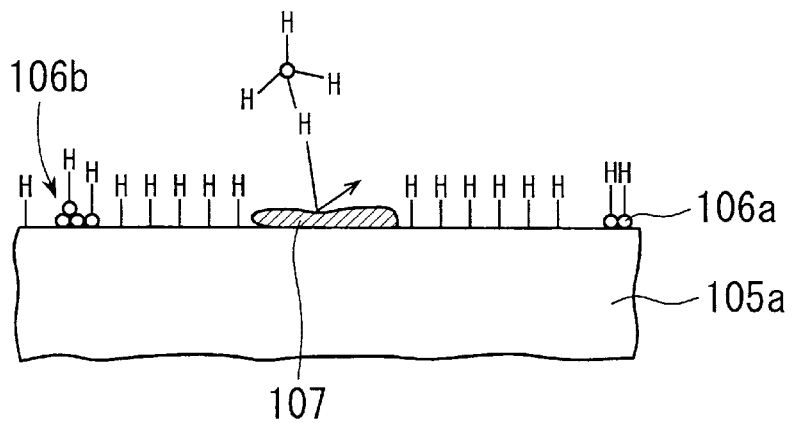
FIGS. 4A–4C are cross sectional views illustrating phenomena which is considered to occur in a conventional process of forming an HSG-Si portion.
Figure 4B:
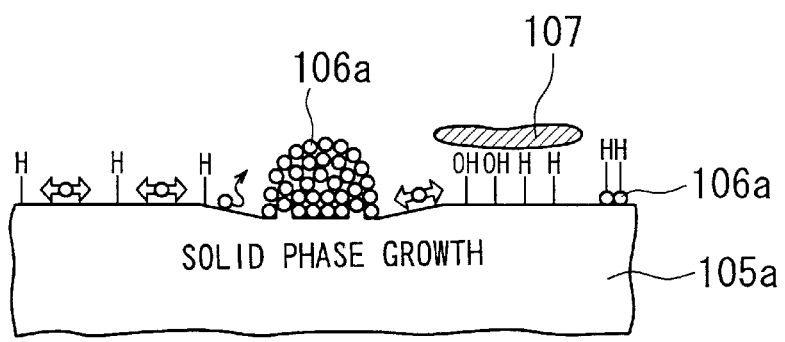
Figure 4C:
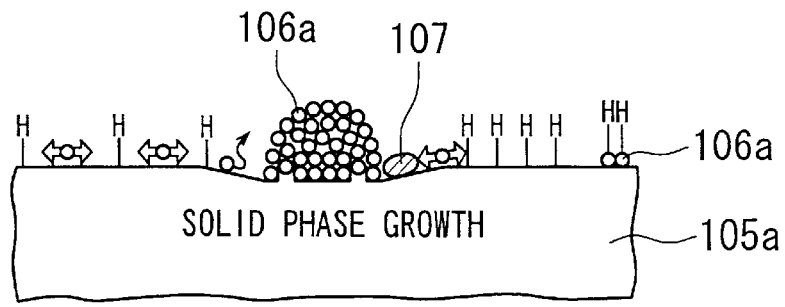
Figure 9:
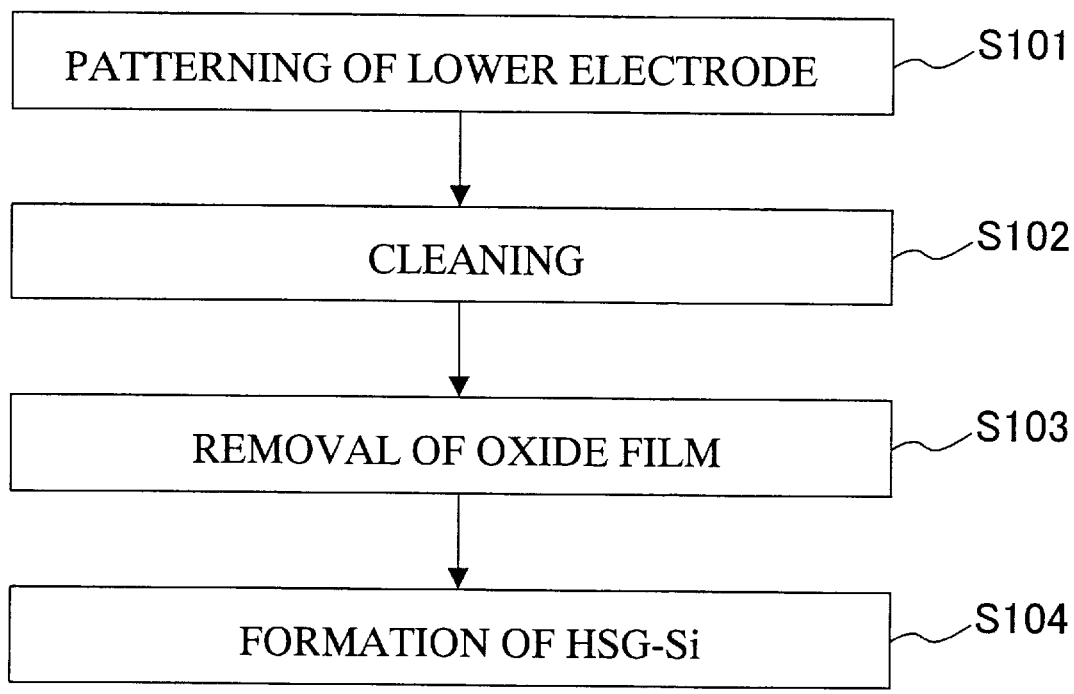
FIG. 9 is a flow chart showing a conventional method of forming unevenness on the surface of a lower electrode by using HSG-Si which comprises hemispherical grains of silicon crystal.

In the conventional technology described before with reference to FIG. 9, a process of heat and dehydration treatment like that of the present embodiment is not included. Therefore, the inventor of this invention has found that the following phenomenon occurs in the conventional technology. FIGS. 4A–4C are cross sectional views illustrating the phenomenon which is considered to occur in the conventional process of forming the HSG-Si portion. When the HSG nuclei are formed in a reaction furnace by the heat treatment, moisture remaining in the interlayer insulating film on the semiconductor substrate comes out onto the surface of the P-doped a-Si film. Thus, there is some possibility that such moisture attaches to the surface of the P-doped a-Si film. As shown in FIG. 4A, such moisture reacts with the surface portion of the P-doped a-Si film 5a and, thereby, oxide foreign object 107 is formed.

In the area where such oxide foreign object 107 exists, the HSG nuclei 16b are not formed even if $SiH_4$ gas is applied thereto.

Also, as shown in FIG. 4B, thermal separation or desorption of hydrogen atoms is suppressed at the surface portion of the P-doped a-Si film where the oxide foreign object 107 exists. Such suppression of thermal separation of hydrogen atoms deteriorates, that is, reduces the degree of, surface migration of silicon atoms 106a. Further, as shown in FIG. 4C, the oxide foreign object 107 itself directly deteriorates surface migration of the silicon atoms 106a. Such deterioration of surface migration of silicon atoms becomes one of major causes of interrupting formation of the HSG-Si portion having a large surface area.

For the reasons mentioned above, in the conventional technology, the HSG-Si portion can not be formed uniformly and stably, and it was difficult to form the lower electrode of a capacitor having uniform unevenness portion. Therefore, the conventional technology is not satisfactory as a mass production technology for semiconductor devices.

On the other hand, as mentioned above, in the method according to the present embodiment, even if a semiconductor wafer on which many semiconductor devices are to be formed is temporarily stored during manufacture of the semiconductor devices, in a mass production line of the semiconductor devices, moisture in the interlayer insulating film 3 comprising a silicon oxide film is previously removed in the process of heat and dehydration treatment (step S3). Thus, problems mentioned above in the description concerning the conventional technology do not arise at all. Therefore, according to the present invention, it is possible to uniformly and stably form the unevenness constituted of the HSG-Si portions on the surface of the lower electrode of a capacitor. Also, according to the present invention, it is possible to reproducibly and reliably form the unevenness constituted of the HSG-Si portions on the surface of the lower electrode of a capacitor. As a result thereof, the manufacturing method according to the present invention is quite satisfactory as a mass production technology for semiconductor devices.

Figure 5:
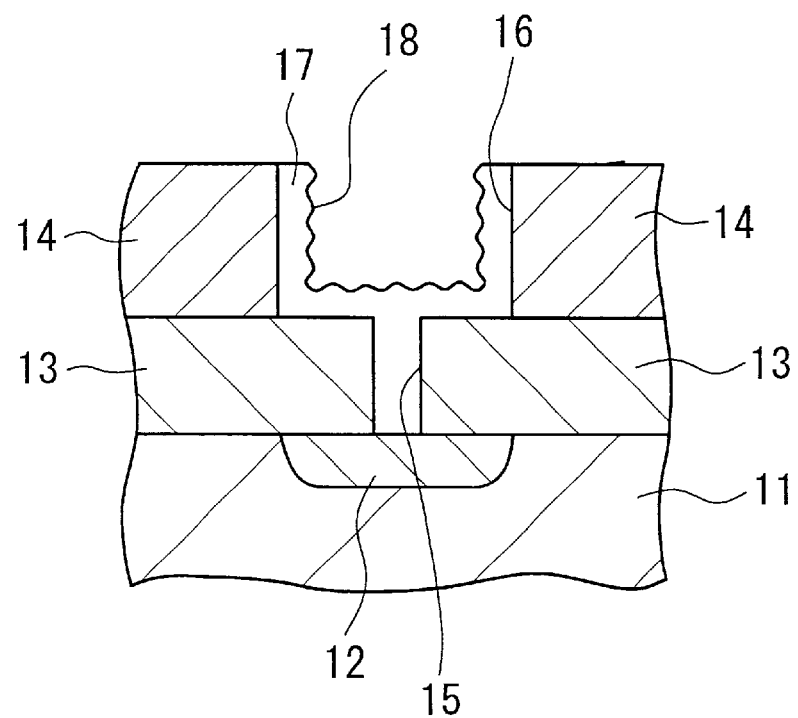
FIG. 5 is a cross sectional view schematically showing a lower electrode of a capacitor according another embodiment of the present invention, which lower electrode has a cylindrical structure buried in an interlayer insulating film.
Figure 6:
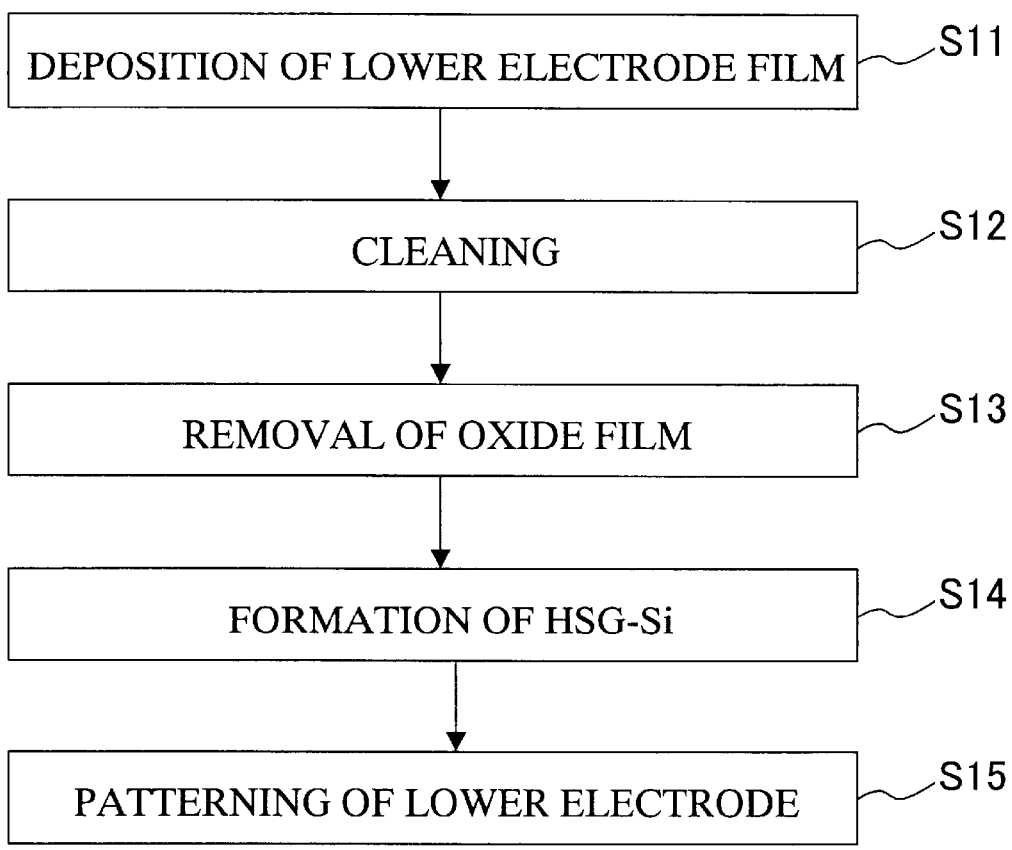
FIG. 6 is a flow chart showing a manufacturing process of a lower electrode of a capacitor shown in FIG. 5.

With reference to FIG. 5 and FIG. 6, a description will now be made on a second embodiment of the present invention. FIG. 5 is a cross sectional view schematically showing a lower electrode of a capacitor which has a cylindrical structure buried in an interlayer insulating film. FIG. 6 is a flow chart showing a manufacturing process of a lower electrode of a capacitor according to the second embodiment. The cylindrical structure shown in FIG. 5 is suitable for use in the second embodiment. This embodiment is characterized in that patterning of the lower electrode is performed after forming an HSG-Si portion.

First, in this embodiment, as shown in FIG. 5, a diffusion layer 12 for a capacitor is formed within and in the proximity of the surface of a semiconductor substrate, i.e., a silicon substrate 11. An interlayer insulating film 13 which comprises a silicon oxide film is formed on whole area of the silicon substrate 11. On the interlayer insulating film 13, there is formed an insulating film 14 for a lower electrode. In the insulating film 14 for the lower electrode, a trench 16 for the lower electrode is formed. At a portion of the interlayer insulating film 13 exposed via the trench 16 for the lower electrode, a contact hole 15 is formed which reaches the surface of the diffusion layer 12 for a capacitor. Then, a P-doped a-Si film which is to become a lower electrode is formed. Thereafter, surface unevenness 18 comprising HSG-Si portion is formed on the surface of the P-doped a-Si film. The P-doped a-Si film is then patterned to form a lower electrode 17.

Next, with reference to FIG. 6, a more detailed explanation will be made on a process of fabricating a lower electrode 17 according to the second embodiment. As shown in FIG. 6, a P-doped a-Si film is deposited on the insulating film 14 such that material of the P-doped a-Si film fills the contact hole and contacts the diffusion layer 12 for the capacitor via the contact hole 15, and such that the material is deposited on the bottom and side walls of the trench 16 for the lower electrode. That is, deposition of a lower electrode film is performed (step S11). Then, cleaning by chemical solution is performed (step S12). By using dilute hydrofluoric acid, an oxide film such as a native oxide film is removed (step S13).

The workpiece, that is, the semiconductor substrate, is inserted into a reaction furnace having high vacuum condition, and a process similar to the process of forming the HSG-Si portion according to the first embodiment is performed (step S14). That is, on the surface of the P-doped a-Si film which is not patterned, HSG nuclei are formed similarly to the first embodiment, and the HSG-Si portion is formed on whole surface of the P-doped a-Si film by annealing.

Then, the P-doped a-Si film in which the surface unevenness is formed is microfabricated by using photolithography technology and dry etching technology into a predetermined shape. That is, the P-doped a-Si film is patterned to form the lower electrode 17 (step S15).

Thereafter, although not shown in the drawing, a capacitor insulating film and an upper electrode are sequentially formed on the lower electrode 17. Thereby, a capacitor, for example, a capacitor of a DRAM device, is completed.

In the second embodiment, the process of forming the HSG-Si portion is performed in the condition the interlayer insulating film 13 and the insulating film 14 for the lower electrode are completely covered by the P-doped a-Si film. Therefore, in the process of forming the HSG-Si portion (step S14), coming out of moisture from the interlayer insulating film 13 and the insulating film 14 for the lower electrode can be suppressed. Thus, unfavorable oxide foreign object formed in the conventional technology is not formed in this embodiment. As a result thereof, in the second embodiment, it is possible to obtain advantageous effects similar to those of the first embodiment. Therefore, it becomes possible to fabricate a lower electrode of a capacitor in which the surface unevenness is uniformly formed.

It is also possible to apply the method according to the second embodiment to the method according to the first embodiment. In such case, in the above-mentioned manufacturing method according to the first embodiment, the process of patterning the P-doped a-Si film (step S1) is performed after the step of forming HSG-Si portion (step S5). In this case, it is possible to omit the process of heat and dehydration treatment process (step S3).

Figure 7A:
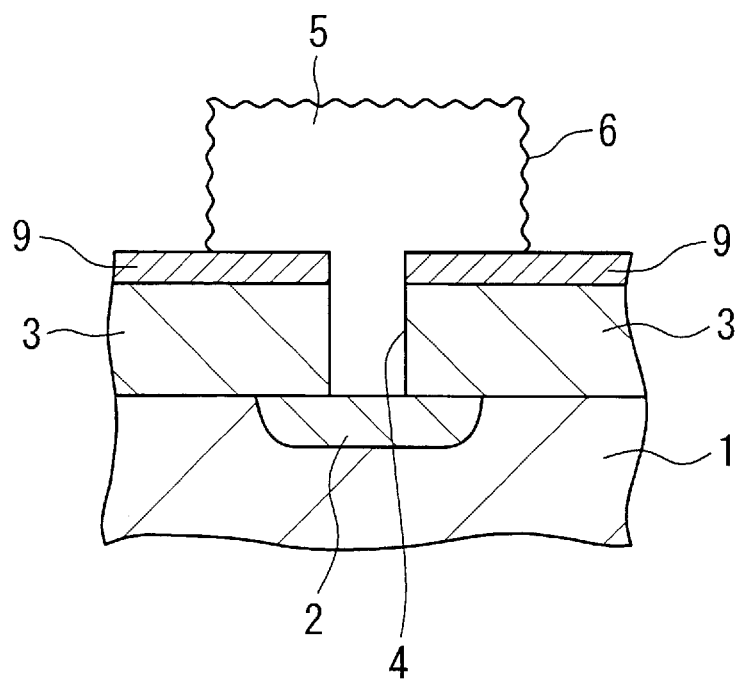
FIG. 7A is a schematic cross sectional view showing a condition in which a lower electrode for fabricating a capacitor is formed according to still another embodiment.
Figure 7B:
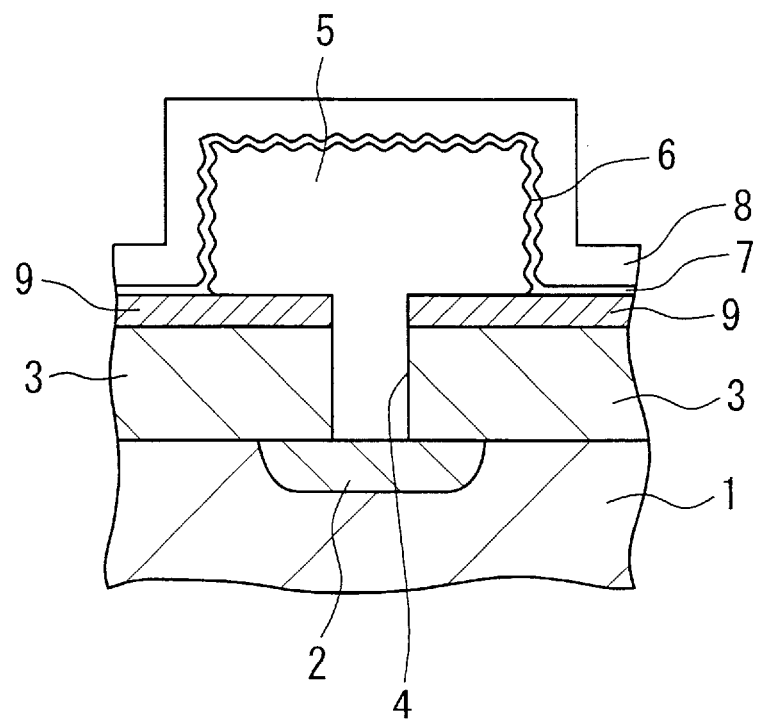
FIG. 7B is a schematic cross sectional view showing a capacitor fabricated by using the lower electrode shown in FIG. 7A.
Figure 8:
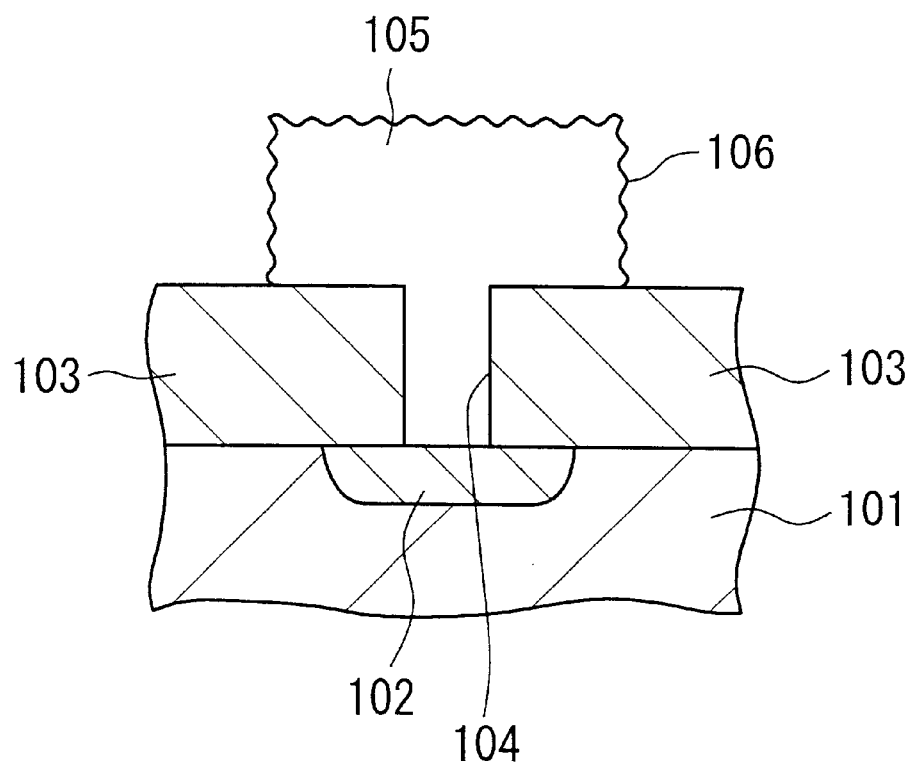
FIG. 8 is a cross sectional view showing a schematic structure of a lower electrode of a conventional capacitor.

With reference to FIG. 7A and FIG. 7B, a description will now be made on a third embodiment of the present invention. FIG. 7A is a schematic cross sectional view showing a condition in which a lower electrode is formed for fabricating a capacitor according to the third embodiment. FIG. 7B is a schematic cross sectional view showing a fabricated capacitor. This embodiment is characterized in that an insulating layer 9 for preventing moisture from coming out of the surface of an interlayer insulating film 3 is formed on the surface of the interlayer insulating film 3. In FIGS. 7A and 7B, portions similar to those of FIG. 1 are designated by the same reference symbols.

As shown in FIG. 7A, a diffusion layer 2 for a capacitor is formed within and in the proximity of the surface of a silicon substrate 1. An interlayer insulating film 3 which comprises a silicon oxide film is then formed on whole area of the silicon substrate 1. On the surface of the interlayer insulating film 3, there is stacked or formed an insulating film 9 for avoiding absorption of moisture. The insulating film 9 for avoiding absorption of moisture is made of a water resistant material film such as a silicon nitride film or a silicon oxynitride film having a film thickness of, for example, 20 nm.

The insulating film 9 for avoiding absorption of moisture and the interlayer insulating film 3 are selectively removed to form a contact hole 4 which reaches the surface of the diffusion layer 2 for a capacitor. Then, a lower electrode 5 which connects to the diffusion layer 2 for a capacitor is formed. That is, the P-doped a-Si film is formed on the insulating film 9 for avoiding absorption of moisture such that material of the P-doped a-Si film fills the contact hole 4, and thereafter the P-doped a-Si film is patterned to form the lower electrode 5. On the surface of the lower electrode 5, the surface unevenness 6 is formed by using the HSG-Si. FIG. 7A shows a structure obtained in this way. Here, the process of forming the HSG-Si portion may be substantially the same as that of the above-mentioned first embodiment, and detailed description thereof is omitted here. Further, a capacitor insulating film (a dielectric film) 7 and an upper electrode 8 are sequentially formed on the lower electrode 5 and the insulating film 9 for avoiding absorption of moisture. The capacitor insulating film 7 and the upper electrode 8 are patterned into a desired shape if necessary. Thereby, a capacitor, for example, a capacitor of a DRAM device, having a structure shown in FIG. 7B is completed.

In this embodiment, the lower electrode of a capacitor may also be fabricated by using the manufacturing process which is the same as that described before with reference to FIG. 9. In the third embodiment, since the interlayer insulating film 3 is covered by the insulating film 9 for avoiding absorption of moisture, moisture hardly comes out from the interlayer insulating film 3 in the process of forming the HSG-Si portion. Therefore, according to the third embodiment, it is possible to obtain advantageous effects similar to those described with respect to the first and second embodiments. Further, in the third embodiment, it is possible to make the manufacturing time shorter than that of each of the first and second embodiments.

According to the present invention, it is possible to effectively prevent moisture from coming out from the interlayer insulating film formed on the semiconductor substrate, in the heat treatment process or processes for forming the HSG nuclei and the HSG-Si portion on the surface of the a-Si film which becomes a lower electrode of a capacitor.

Thereby, in a mass production process of a semiconductor device, it is possible to uniformly and stably form unevenness portion comprising HSG-Si portion, on the surface of a lower electrode of a capacitor. Therefore, it is possible to surely obtain a capacitor having capacitance value which satisfies a predetermined standard, and it is possible to greatly improve a manufacturing yield of a semiconductor device including such capacitor. Because of these reasons, manufacturing costs of semiconductor devices having a high integration degree, such as DRAM devices and the like, can be greatly reduced.

In this way, according to the present invention, it is possible to reliably manufacture semiconductor devices having very high integration degree and very high element density.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a lower electrode of a capacitor comprising:

preparing a semiconductor substrate;

forming an insulating film on said semiconductor substrate;

forming a silicon film on said insulating film;

selectively removing said silicon film to pattern it;

heating said semiconductor substrate to remove moisture in said insulating film;

after heating said semiconductor substrate to remove moisture in said insulating film, removing an oxide film formed on the surface of said silicon film;

after removing said oxide film formed on the surface of said silicon film, forming silicon nuclei on the surface of said silicon film by heating said semiconductor substrate in atmosphere containing silicon compound gas; and growing said silicon nuclei and thereby forming a lower electrode which has hemispherical grains formed on the surface of said lower electrode.

2. A method of manufacturing a lower electrode of a capacitor as set forth in claim 1, wherein, in said forming said silicon film on said insulating film, an amorphous silicon film in which impurities are doped is formed on said insulating film.

3. A method of manufacturing a lower electrode of a capacitor as set forth in claim 1, wherein said insulating film comprises a film which includes silicon oxide as main component.

4. A method of manufacturing a lower electrode of a capacitor as set forth in claim 1, wherein, in said heating said semiconductor substrate to remove moisture in said insulating film, said semiconductor substrate is heated at a temperature in a range between 450 and 500 degrees Celsius.

5. A method of manufacturing a lower electrode of a capacitor as set forth in claim 1, wherein said method further comprises selectively removing said insulating film to form an opening portion penetrating said insulating film; and wherein, in said forming said silicon film on said insulating film, said silicon film is formed on said insulating film such that material of said silicon film fills said opening portion and contacts said semiconductor substrate via said opening portion.

6. A method of manufacturing a lower electrode of a capacitor comprising:

preparing a semiconductor substrate;

forming an insulating film on said semiconductor substrate;

forming a silicon film on whole surface of said insulating film;

removing a native oxide film formed on said silicon film;

after said removing a native oxide film formed on said silicon film, forming silicon nuclei on the surface of said silicon film by heating said semiconductor substrate in atmosphere containing silicon compound gas;

growing said silicon nuclei and thereby forming hemispherical grains on the surface of said silicon film; and selectively removing said silicon film having hemispherical grains formed on the surface thereof and thereby forming a lower electrode.

7. A method of manufacturing a lower electrode of a capacitor as set forth in claim 6, wherein, in said forming said silicon film on whole surface of said insulating film, an amorphous silicon film in which impurities are doped is formed on whole surface of said insulating film.

8. A method of manufacturing a lower electrode of a capacitor as set forth in claim 6, wherein said insulating film comprises a film which includes silicon oxide as main component.

9. A method of manufacturing a lower electrode of a capacitor as set forth in claim 6, wherein said method further comprises selectively removing said insulating film to form an opening portion penetrating said insulating film; and wherein, in said forming said silicon film on whole surface of said insulating film, said silicon film is formed on whole surface of said insulating film such that material of said silicon film fills said opening portion and contacts said semiconductor substrate via said opening portion.

10. A method of manufacturing a lower electrode of a capacitor comprising:

preparing a semiconductor substrate;

forming an insulating film on said semiconductor substrate;

selectively removing said insulating film to form a trench;

forming a silicon film on said insulating film such that said silicon film is deposited on substantially all of an upper surface of said insulating film and on the bottom and side walls of said trench;

removing a native oxide film formed on said silicon film;

after said removing a native oxide film formed on said silicon film, forming silicon nuclei on the surface of said silicon film by heating said semiconductor substrate in atmosphere containing silicon compound gas;

growing said silicon nuclei and thereby forming hemispherical grains on the surface of said silicon film; and selectively removing said silicon film having hemispherical grains formed on the surface thereof and thereby forming a lower electrode.

11. A method of manufacturing a lower electrode of a capacitor as set forth in claim 10, wherein said insulating film has a multi layer structure comprising a first insulating film and a second insulating film on said first insulating film;

wherein, in said selectively removing said insulating film to form a trench, said second insulating film is selectively removed to form a first opening portion constituting said trench, and said first insulating film is exposed at the bottom portion of said first opening portion; and wherein, in said forming a silicon film on said insulating film, said silicon film is deposited on the portion of said first insulating film which expose at the bottom portion of said first opening portion and on the side wall of said first opening portion.

12. A method of manufacturing a lower electrode of a capacitor as set forth in claim 11, wherein said method further comprises, after selectively removing said insulating film to form a trench, selectively removing a portion of said first insulating film which exposes via said first opening portion to form a second opening portion smaller than said first opening portion; and wherein, in said forming a silicon film on said insulating film, material of said silicon film fills said second opening portion of said first insulating film and contacts said semiconductor substrate.

13. A method of manufacturing a lower electrode of a capacitor as set forth in claim 10, wherein, in said forming said silicon film on said insulating film, an amorphous silicon film in which impurities are doped is formed on whole surface of said insulating film.

14. A method of manufacturing a lower electrode of a capacitor as set forth in claim 11, wherein said first insulating film comprises a film which includes silicon oxide as main component.

15. A method of manufacturing a lower electrode of a capacitor comprising:

preparing a semiconductor substrate;

forming a first insulating film on said semiconductor substrate;

forming a second insulating film on said first insulating film, said second insulating film is made of water resistant material;

forming a silicon film on said second insulating film;

selectively removing said silicon film to pattern said silicon film;

removing a native oxide film formed on the surface of said silicon film;

after said removing a native oxide film formed on the surface of said silicon film, forming silicon nuclei on the surface of said silicon film by heating said semiconductor substrate in atmosphere containing silicon compound gas; and growing said silicon nuclei and thereby forming a lower electrode which has hemispherical grains on the surface of said lower electrode.

16. A method of manufacturing a lower electrode of a capacitor as set forth in claim 15, wherein, in said forming said silicon film on said second insulating film, an amorphous silicon film in which impurities are doped is formed on said second insulating film.

17. A method of manufacturing a lower electrode of a capacitor as set forth in claim 11, wherein said first insulating film comprises a film which includes silicon oxide as main component, and said second insulating film comprises a film or films selected from a group of films consisting essentially of a silicon nitride film and a silicon oxynitride film.

18. A method of manufacturing a lower electrode of a capacitor as set forth in claim 15, wherein said method further comprises selectively removing said first and second insulating film to form an opening portion which penetrates said first and second insulating film; and wherein, in said forming a silicon film on said second insulating film, said silicon film is formed on said second insulating film such that material of said silicon film fills said opening portion and contacts said semiconductor substrate.

* * * * *